(12) United States Patent
Liu

(10) Patent No.: US 10,915,442 B2
(45) Date of Patent: Feb. 9, 2021

(54) MANAGING BLOCK ARRANGEMENT OF SUPER BLOCKS

(71) Applicant: Macronix International Co., Ltd., Hsinchu (TW)

(72) Inventor: Ting-Yu Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 16/572,922

(22) Filed: Sep. 17, 2019

(65) Prior Publication Data
US 2020/0012596 A1 Jan. 9, 2020

Related U.S. Application Data

(63) Continuation of application No. 15/836,476, filed on Dec. 8, 2017, now Pat. No. 10,445,230.

(51) Int. Cl.
| | |
|---|---|
| *G06F 12/00* | (2006.01) |
| *G06F 12/02* | (2006.01) |
| *G06F 12/06* | (2006.01) |
| *G11C 29/00* | (2006.01) |
| *G06F 3/06* | (2006.01) |
| *G06F 11/10* | (2006.01) |
| *G11C 16/00* | (2006.01) |
| *G11C 29/52* | (2006.01) |

(52) U.S. Cl.
CPC .......... *G06F 12/0246* (2013.01); *G06F 3/061* (2013.01); *G06F 3/064* (2013.01); *G06F 3/0616* (2013.01); *G06F 3/0679* (2013.01); *G06F 3/0688* (2013.01); *G06F 11/1048* (2013.01); *G06F 12/0646* (2013.01); *G11C 16/00* (2013.01); *G11C 29/76* (2013.01); *G06F 2212/7201* (2013.01); *G06F 2212/7202* (2013.01); *G06F 2212/7209* (2013.01); *G11C 29/52* (2013.01)

(58) Field of Classification Search
CPC ............. G06F 12/0246; G06F 12/0646; G06F 11/1048; G06F 3/0688; G06F 2212/7201; G06F 2212/7202; G06F 2212/7209; G06F 3/064; G06F 3/0679; G06F 3/061; G06F 3/0616; G11C 29/76; G11C 16/00; G11C 29/52; G11C 2211/5646; G11C 2211/5644; G11C 16/3495
USPC ........................................................ 711/170
See application file for complete search history.

(56) References Cited

U.S. PATENT DOCUMENTS

| | | | |
|---|---|---|---|
| 7,359,245 | B2 | 4/2008 | Kim et al. |
| 8,095,765 | B2 | 1/2012 | Asnaashari et al. |
| 8,239,614 | B2 | 8/2012 | Asnaashari et al. |
| 8,751,731 | B2 | 6/2014 | Asnaashari et al. |
| 8,832,507 | B2 | 9/2014 | Post et al. |
| 2005/0172065 | A1 | 8/2005 | Keays |
| 2008/0052446 | A1 | 2/2008 | Lasser et al. |

(Continued)

*Primary Examiner* — Mardochee Chery
(74) *Attorney, Agent, or Firm* — Fish & Richardson P.C.

(57) ABSTRACT

Systems, methods, and apparatus including computer-readable mediums for managing block arrangement of super blocks in a memory such as NAND flash memory are provided. In one aspect, a memory controller for managing block arrangement of super blocks in a memory includes control circuitry coupled to the memory having at least two planes of physical blocks and configured to maintain block information of each individual physical block in the planes and select one or more physical blocks from the planes for a super block based on the block information of the physical blocks in the planes.

20 Claims, 14 Drawing Sheets

(56) References Cited

U.S. PATENT DOCUMENTS

| | | |
|---|---|---|
| 2012/0191897 A1 | 7/2012 | Yang et al. |
| 2015/0043277 A1 | 2/2015 | Fitzpatrick et al. |
| 2016/0180926 A1 | 6/2016 | Young |
| 2016/0283138 A1 | 9/2016 | Lehman et al. |

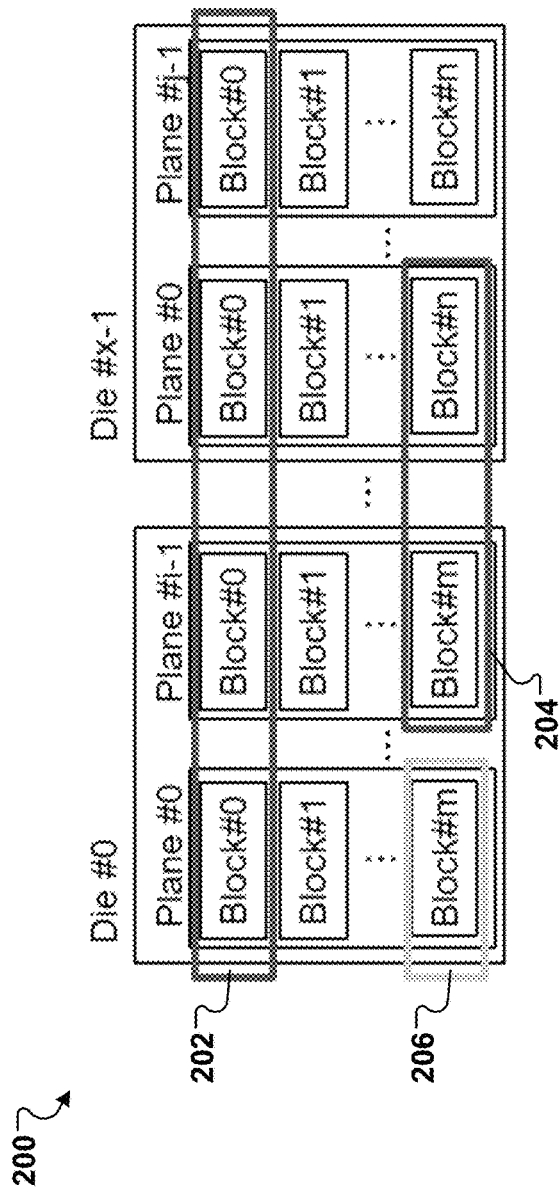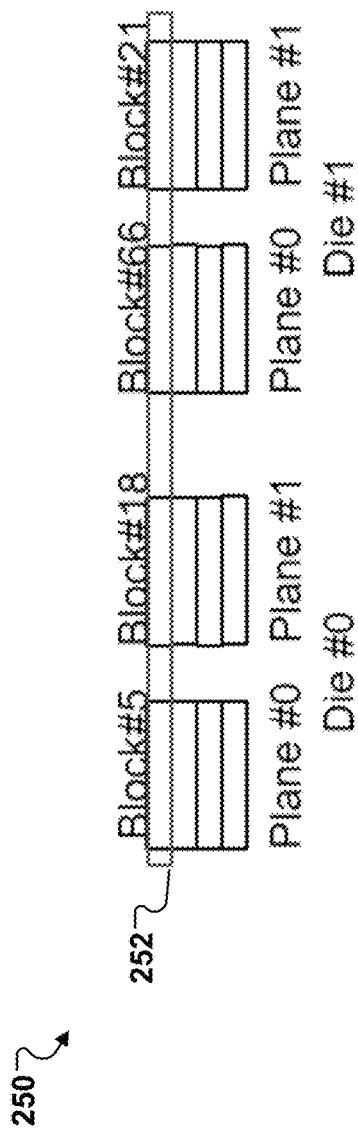
FIG. 2A
FIG. 2B

| Single Block Number | CDB Flag | Unused Flag | Erase Count | Valid Count | Read Count by page | | |
|---|---|---|---|---|---|---|---|
| 1 | true | false | 6 | 102 | 100 | 54 | ... | 77 |
| ... | | | | | | | |
| N-1 | false | true | 5 | 0 | 0 | 0 | ... | 0 |

| Current Erase Counts | | | | | | | | | | |
|---|---|---|---|---|---|---|---|---|---|---|
| Weight (%) | 90 | 80 | 70 | 60 | 50 | 40 | 30 | 20 | 10 | 0 |

| Retry Times | <2 times | 2 times | 4 times | 6 times | >=7 times |
|---|---|---|---|---|---|
| Weight (%) | 100 | 60 | 30 | 10 | 0 |

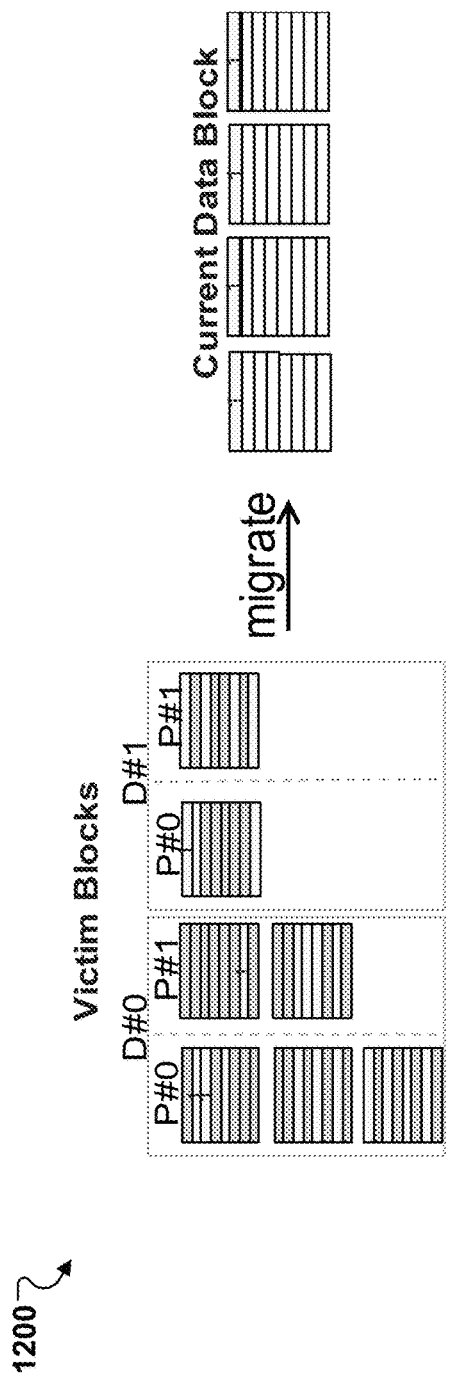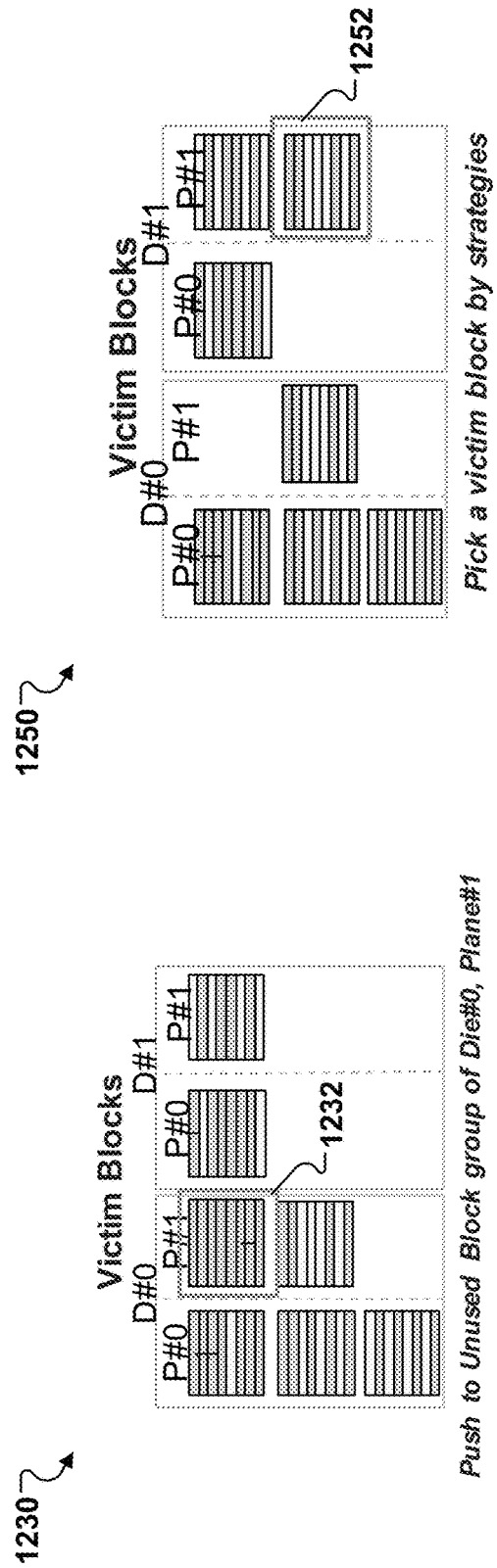
FIG. 12A
FIG. 12B
FIG. 12C

MANAGING BLOCK ARRANGEMENT OF SUPER BLOCKS

CROSS-REFERENCE TO RELATED APPLICATIONS

This application is a continuation application of and claims priority to U.S. application Ser. No. 15/836,476, filed on Dec. 8, 2017.

BACKGROUND

To manage a memory such as a NAND flash memory, logical super blocks can be specified such that each super block combines multiple physical blocks from different planes in the memory. The physical blocks in a super block can be operated simultaneously. However, normally the super blocks are initially specified in the memory, each super block is managed as a whole block where the combination of the physical blocks never changes until one of them wears out, and there is no optimal arrangement of data within the super block, which may cause poor efficiency.

SUMMARY

The present disclosure describes systems and techniques for managing block arrangement of super blocks in a memory, e.g., a non-volatile memory system such as NAND flash memory, which can improve (or optimize) efficiency by managing physical blocks with a fine granularity.

One aspect of the present disclosure features a memory controller for managing block arrangement of super blocks in a memory, including control circuitry coupled to the memory having at least two planes of physical blocks and configured to maintain block information of each individual physical block in the planes and combine one or more physical blocks from the planes to a super block based on the block information of the physical blocks in the planes. The block information of the physical block can include at least one of erase count, valid count, read counts of pages, erase delay time, a first flag indicating whether the physical block is in a current data block, or a second flag indicating whether the physical block is an unused block.

In some implementations, the control circuitry is configured to, for each of the planes, select an unused physical block having a minimum erase count in the physical blocks of the plane based on the block information of the physical blocks of the plane. In some cases, the control circuitry is configured to: determine a threshold based on the erase counts of the selected unused physical blocks from the planes; in response to a determination that a selected unused physical block has an erase count larger than the determined threshold, determine not to select the selected unused physical block for the super block; and in response to a determination that a selected unused physical block has an erase count no larger than the determined threshold, select the selected unused physical block for the super block.

In some implementations, the control circuitry is configured to: determine a respective sum of valid counts of physical blocks in each of the planes; compare the respective sums of valid counts of the planes; and determine, based on a result of the comparison, whether to select a physical block from one of the planes for the super block.

In some implementations, the control circuitry is configured to: determine a respective maximum value of erase count of physical blocks in each of the planes; select a plane having the respective maximum value of erase counts that is smaller than a maximum of the respective maximum values of erase counts; select unused physical blocks in the selected plane, wherein an erase delay time of each of the selected unused physical blocks is larger than a minimum of erase delay times of physical blocks in the selected plane; and select a physical block with a minimum erase count among the selected unused physical blocks.

In some cases, the control circuitry is configured to: in response to a determination that the super block is incapable of storing more data, release the super block to obtain individual data blocks. In some cases, the control circuitry is configured to: in response to a determination that a number of unused blocks in a plane is smaller than a first reclaim threshold, pick a physical block with a minimum valid count in the plane as a victim block.

In some implementations, the control circuitry is configured to: in response to a determination that a number of unused blocks in a plane is no smaller than a first reclaim threshold and that there is an urgent block in the plane, pick the urgent block as a victim block. The control circuitry can be configured to determine a physical block to be an urgent block by determining at least one of: that a program failure has occurred in the physical block, that a number of error bits in the physical block exceeds a first threshold, or that the number of error bits in the physical block is smaller than the first threshold and exceeds a second threshold, the second threshold being smaller than the first threshold.

In some implementations, the control circuitry is configured to: in response to a determination that a number of unused blocks in a plane is no smaller than a second reclaim threshold, pick a physical block in the plane as a victim block by comparing a weight value to a threshold, where the weight value of the physical block is determined based on one or more parameters including block type, valid count, erase order, and erase delay time. In some cases, the control circuitry is configured to: determine a respective number of victim blocks of each of the planes; select a plane having a maximum of the respective numbers of victim blocks among the planes, the selected plane including one or more other physical blocks having the weight values smaller than the predetermined threshold, where a smaller valid count corresponds to a smaller weight value than a larger valid count, and a longer erase delay time corresponds to a smaller weight value than a shorter erase delay time; and pick the physical block by determining that the physical block is in a logical to physical (L2P) table same as a particular number of victim blocks in the plane and the particular number is higher than that of each of the one or more other physical blocks in the plane.

The control circuitry can be configured to: arrange valid data in one or more victim blocks from one or more planes to be migrated based on one or more reclaim priority polices; and migrate the valid data simultaneously to a current data block. The control circuitry can be also configured to: erase a victim block having no valid data to obtain an unused physical block.

In some implementations, the control circuitry is configured to determine one or more characteristics of data to be written in the memory. The data can include at least one of data from a device external from the memory, valid data to be migrated from the memory, or metadata associated with the memory, and the characteristics can include at least one of a security level, an internal system level, or a level of read & write frequency.

In some cases, the control circuitry is configured to combine the physical blocks from each of the planes to the super block based on the determined characteristics of the data to be written. In some cases, the control circuitry is configured to: in response to a determination that there is no blank super page to store the data, combine the physical blocks from each of the planes to the super block; erase each of the selected physical blocks based on the determined characteristics of the data to be written; and combine single pages from the physical blocks in the planes to obtain a super page for storing the data. In some cases, the control circuitry is configured to: categorize the data based on the determined characteristics of the data; arrange the data to individual physical blocks in the super block based on the determined characteristics of the data and the block information of the individual physical blocks in the super block; and program one or more super pages of the super block to store the data.

Another aspect of the present disclosure features a memory system including: a memory comprising at least two planes of physical blocks; and a memory controller configured to manage the physical blocks of the memory by maintaining block information of each individual physical block in the planes and combining one or more physical blocks from the planes to a super block based on the block information of the physical blocks in the planes.

A further aspect of the present disclosure features a method of managing block arrangement of super blocks in a memory by a memory controller, including: maintaining, by a control circuitry in the memory controller, block information of each individual physical block in at least two planes of the memory; determining, by the control circuitry, one or more characteristics of data to be written in the memory; and combining, by the control circuitry, one or more physical blocks from the planes to a super block based on the block information of the physical blocks in the planes and the determined characteristics of the data.

Implementations of the above techniques include methods, circuits, systems, computer program products and computer-readable media. In one example, a method can be performed by a memory controller coupled to a non-volatile memory, and the method can include the above-described actions performed by the memory controller, e.g., the actions for managing block arrangements of super blocks. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The techniques can record management information, e.g., erase count and/or valid count, of each single physical block in different planes of a memory and refer to the information to combine (or arrange) at least one physical block in the different planes to write external data, metadata and/or migrate internal valid data. Note that block information of a block mainly refers to information associated with usage of the block including erase count, valid count, read count by page, erase delay time, unused flag, or CDB flag, and the block information may not include memory address of the block and/or a block number (or a position number) in its plane. Compared to binding physical blocks in a super block for management, the techniques can improve reclaim efficiency, reduce data migration, reduce erase counts of the physical blocks, and solve performance and lifetime degrading problems caused by unnecessary copying. The techniques can be implemented by any appropriate type of controller to improve efficiency of the memory. The controller can be part of the memory, reside in a host coupled to the memory, or externally coupled to the host and the memory and/or cooperating with the host. The controller can include flash transition layer (FTL) management.

The techniques can be applied to various memory types, such as SLC (single-level cell) devices, MLC (multi-level cell) devices like 2-level cell devices, TLC (triple-level cell) devices, QLC (quad-level cell) devices, or any suitable combination thereof. The techniques can be applied to various types of non-volatile memory systems, such as NAND flash memory, NOR flash memory, AND flash memory, phase-change memory (PCM), or others. Additionally or alternatively, the techniques can be applied to various types of devices and systems, such as secure digital (SD) cards, embedded multimedia cards (eMMC), solid-state drives (SSDs), embedded systems, hard disks, optical disks, tapes, or others. The systems can be mixed systems including more than one type of storage devices above.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 2A illustrates example super blocks specified in a memory, according to one or more implementations.

FIG. 2B illustrates another example super block in a memory, according to one or more implementations.

FIG. 4A illustrates an example block information table of a plane in a memory, according to one or more implementations.

FIGS. 4B-4C illustrate examples of erase information tables of a block, according to one or more implementations.

FIG. 12A illustrates an example data migration step in a reclaim operation, according to one or more implementations.

FIG. 12B illustrates an example block freeing step in the reclaim operation of FIG. 12A, according to one or more implementations.

FIG. 12C illustrates an example victim block picking step in the reclaim operation, according to one or more implementations.

DETAILED DESCRIPTION

Figure 1:
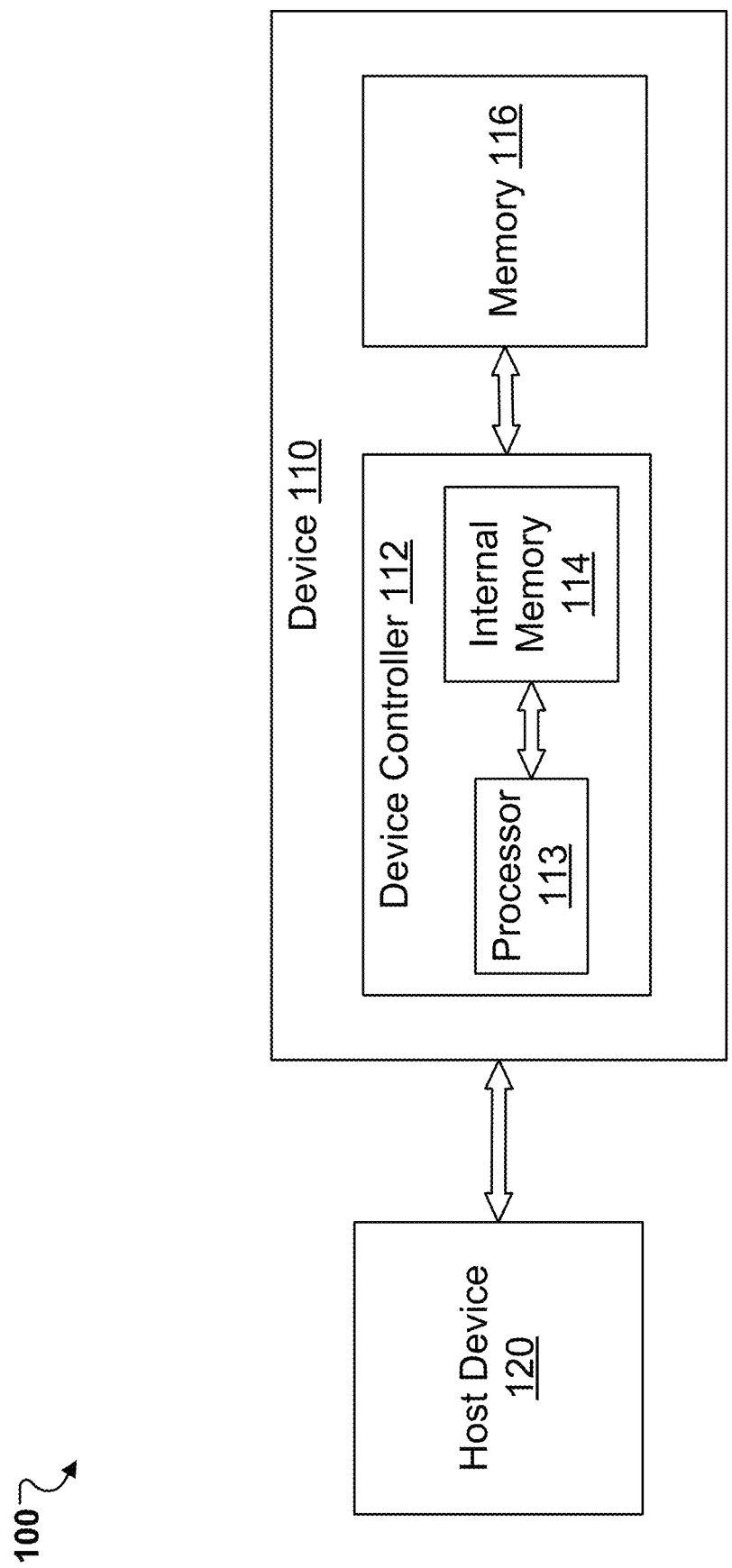
FIG. 1 illustrates an example of a system for memory management, according to one or more implementations.

FIG. 1 illustrates an example of a system 100 for memory management. The system 100 includes a device 110 and a host device 120. The device 110 includes a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to the host device 120. For example, the device 110 is an SD card in a digital camera or a media player that is the host device 120.

The device controller 112 can be a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller. The device controller 112 can be also included in the host device 120 or externally coupled to the host device 120 or the device 110.

The processor 113 is configured to execute instructions and process data. The instructions include firmware instructions and/or other program instructions that are stored as firmware code and/or other program code, respectively, in the internal memory 114. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory 114 is a cache memory that is included in the device controller 112, as shown in FIG. 1. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk. For illustration purposes only, the following description uses a NAND flash memory as an example of the memory 116.

As discussed in further details below, the device controller 112 is configured to manage block arrangements of super blocks in the memory 116. The device controller 112 can maintain block information based on individual physical blocks, instead of a whole super block, select a free block in a plane based on a strategy, e.g., based on erase count, combine at least one block in different planes to a super block, and/or select a victim block in a plane based on a strategy, e.g., based on greedy, refresh, or wear-leveling. The device controller 112 can specify a super block or allocate a super page, in response to a demand, e.g., a request to write external data from the host device 120, to migrate valid data from a victim block, and/or to store meta data of the memory 116.

Data can be characterized to be at a security level, an internal system level, or a normal data level. At the normal data level, data can be characterized to have a degree of "hotness" based on frequent write & read. For example, the degree of hotness of data can be gradually reduced from (1) data with frequent read & write, (2) data with frequent write but seldom read, (3) data with seldom write but frequent read, to (4) data with seldom read & write. Data at the security level can include secure or reliable data, which can be considered as hot data. Data at the internal system level can include system management data, which can be considered as hot data.

The device controller 112 can be configured to manage data arrangement in super blocks as described in a US patent application Ser. No. 15/835,859, entitled "MANAGING DATA ARRANGEMENT IN SUPER BLOCKS" and filed on the same date herewith, whose contents are hereby incorporated by reference in their entirety. For example, the device controller 112 can categorize data according to its character (e.g., hot or cold) and scatter data by the character when programming a super page to gather data with the same character in a physical block. Particularly, the device controller 112 can arrange data placement by strategies, e.g., unused block count/erase count by plane, to evenly scatter data with different characters in different planes, and gather data with analogous characters, e.g., adjacent logical address/accessed frequency, in the same plane. The terms "character" and "characteristic" may be used interchangeably herein.

FIG. 2A illustrates example super blocks specified in a memory. The memory can be the memory 116 of FIG. 1. The memory can include one or more memory devices. In some implementations, the memory includes a number of dies.

Each die can be a memory chip and can include a number of memory arrays and peripheral circuitry thereon. A memory array can include a number of planes, with each plane including a number of physical blocks of memory cells. Each physical block can include a number of pages of memory cells that can store a number of sectors of data.

Two physical blocks from a common plane cannot be operated (e.g., erased) simultaneously, but two physical blocks from different planes can be operated simultaneously. A super block can be specified, e.g., by a memory controller such as the controller 112 of FIG. 1, to combine at least one physical block from different planes. Each physical block in the super block comes from a different plane, that is, any plane cannot provide more than one block in the super block. The super block includes a number of super pages each combining multiple pages from the corresponding multiple physical blocks in the super block. Each page in a super page can have a same page number in its corresponding physical block. A super page can be programmed with all the pages in the super page being programmed simultaneously.

As illustrated in FIG. 2A, the memory includes x dies from Die #0 to Die #x−1. Die #0 includes i planes from Plane #0 to Plane #i−1, and each of the planes includes m+1 physical blocks, where 0, 1, . . . , or m is a position number indicating a corresponding block's physical location within its plane. Die #i−1 includes j planes from Plane #0 to Plane #j−1, and each of the planes includes n+1 physical blocks, where 0, 1, . . . , or n is a position number indicating a corresponding block's physical location within its plane. Each of x, i, and j is an integer larger than 1 and each of m and n is an integer larger than 0, where i=j or i j, m=n or m≠n. In some examples, the memory includes multiple dies, and each die includes one plane.

In some examples, a super block includes a number of blocks with a same position number. A super block can include one block from each plane of each dies in the memory; this provides a maximum bandwidth. For example, as illustrated in FIG. 2A, super block 202 includes the blocks with position number 0 from each of the planes in the memory. However, a super block can include blocks with a same position number, but from less than all of the planes, e.g., from less than all dies or less than all planes within a die. For example, super block 204 includes blocks from multiple dies, but not all planes within each die. Thus, super block 204 has less blocks than super block 202 and has a smaller bandwidth. Super block 206 includes only one physical block, e.g., Block #m from one plane, e.g., Plane #0 in Die #0.

In some examples, a super block combines physical blocks with different position numbers from different planes. As illustrated in FIG. 2B, example super block 250 combines Block #5 from Plane #0 in Die #0, Block #18 from Plane #1 in Die #0, Block #66 from Plane #0 in Die #1, and Block #21 from Plane #1 in Die #1. Super page 252 combines four pages from the four blocks in super block 250. The four pages have a same page number in their blocks and can be programmed simultaneously when super page 252 is programmed.

In some examples, a super block combines blocks of the same memory type from different planes, e.g., SLC, MLC, TLC, or QLC. In some examples, a super block combines blocks from different types of memory, e.g., mixed SLC & MLC, from different planes.

As discussed in further details below, a super block can be deployed to write update data, e.g., data outside the memory like data from a host device, to migrate valid data, e.g., data inside the memory, or to write metadata, e.g., data for FTL management. A super block can also be released the combination of blocks if it cannot write/migrate anymore.

Figure 3:
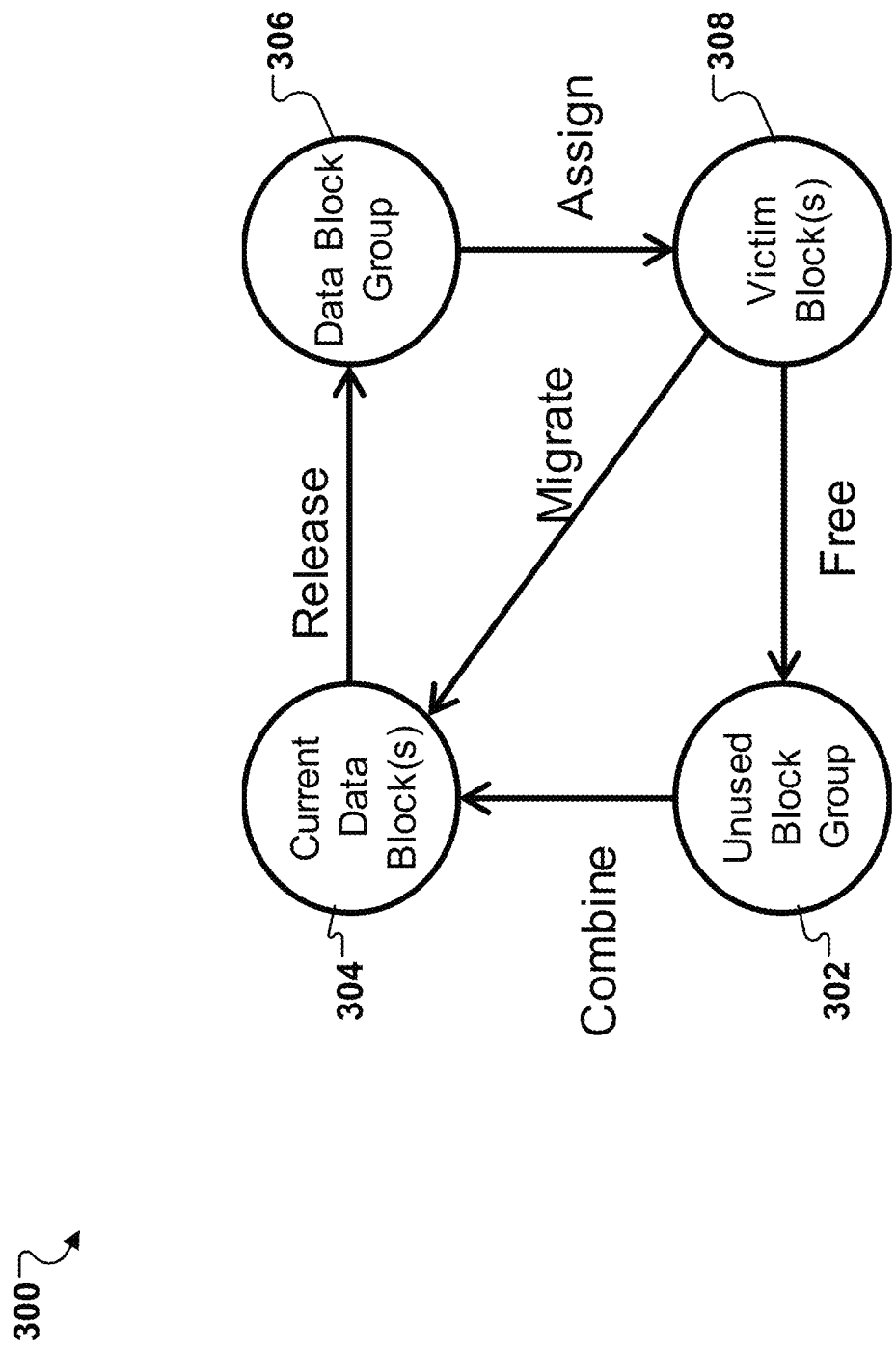
FIG. 3 illustrates an example state diagram of managing blocks in a memory, according to one or more implementations.

FIG. 3 illustrates an example diagram 300 of managing blocks in a memory. The memory can be the memory 116 of FIG. 1, and can be managed by a controller, e.g., the controller 112 of FIG. 1. The diagram 300 shows an overview of managing block arrangements of super blocks in the memory by the controller.

The memory includes a number of planes each having one or more physical blocks. Two-level configuration can be classified to control the physical blocks in the memory. The first level is single block level where data blocks, unused blocks (e.g., free blocks or empty blocks), and "victim" blocks are. As discussed with further details below, a victim block is a block to be reclaimed into an unused block. The second level is super block level where super blocks are current data blocks (CDBs) that are open for data writing.

Initially, for example, when the memory is initialized, the physical blocks in the memory are put into unused block group 302 that is managed at the single block level. The controller maintains block information of individual physical blocks in unused block group 302. The block information is described with further details in FIGS. 4A and 4B.

The controller can select no more than one physical block from each of the planes and combine the selected physical blocks to obtain a super block based on the block information of the physical blocks in the planes. The super block includes at least one physical block combined from the planes. In some cases, the controller can select two or more physical blocks (e.g., SLC blocks) from one plane into the super block. FIGS. 5A to 7 show different implementations or strategies for the combination (or selection) of the super block. The controller can combine one or more super blocks (or CDBs) in the memory. The CDBs are in current data block group 304 that is managed at the super block level.

When a super block (or a current data block) is incapable of storing more data, the current data block is released as individual physical blocks to data block group 306 that is managed at the single block level.

Figure 8:
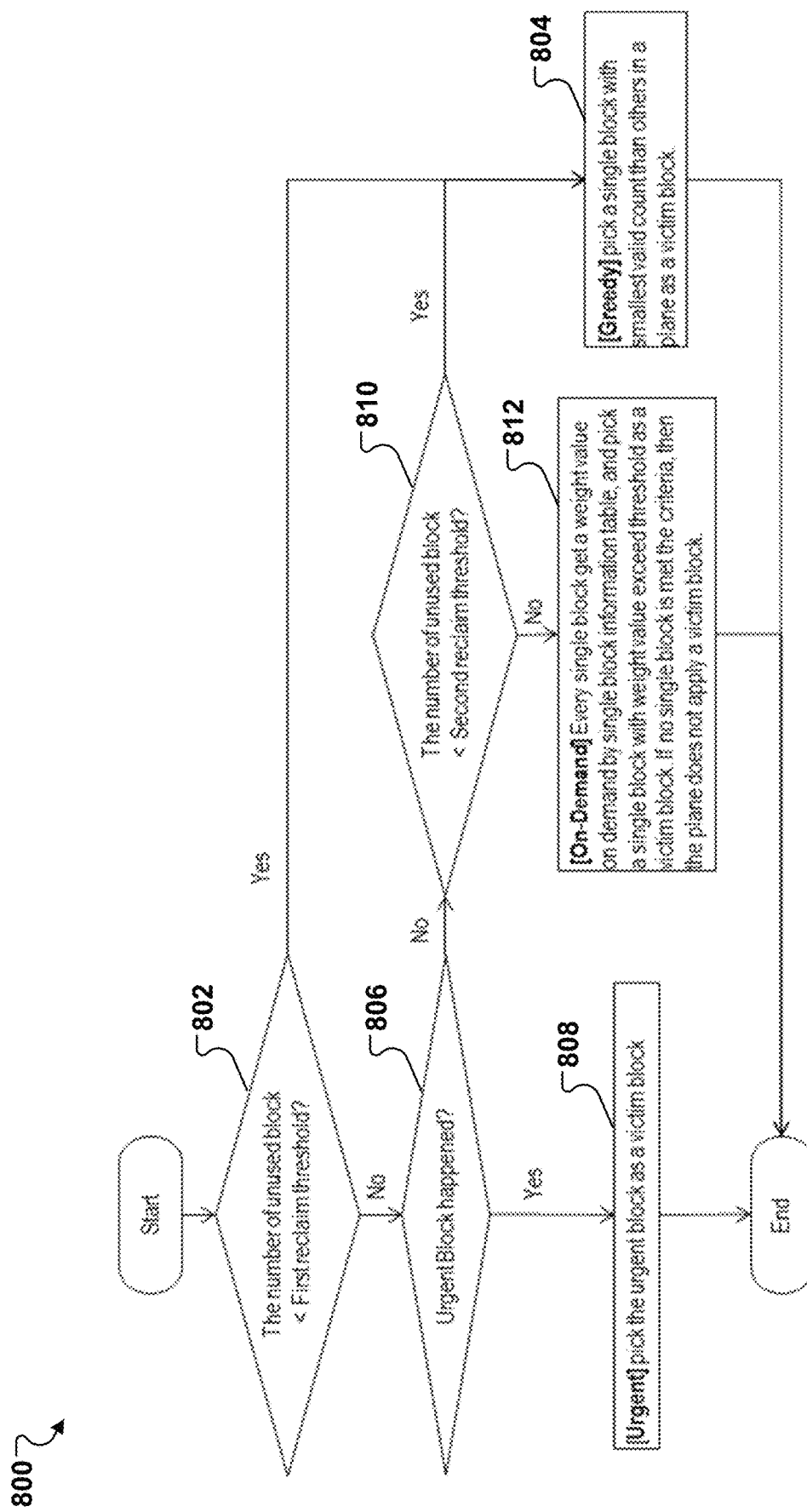
FIG. 8 illustrates an example of a process for picking a victim block in a plane, according to one or more implementations.
Figure 9:
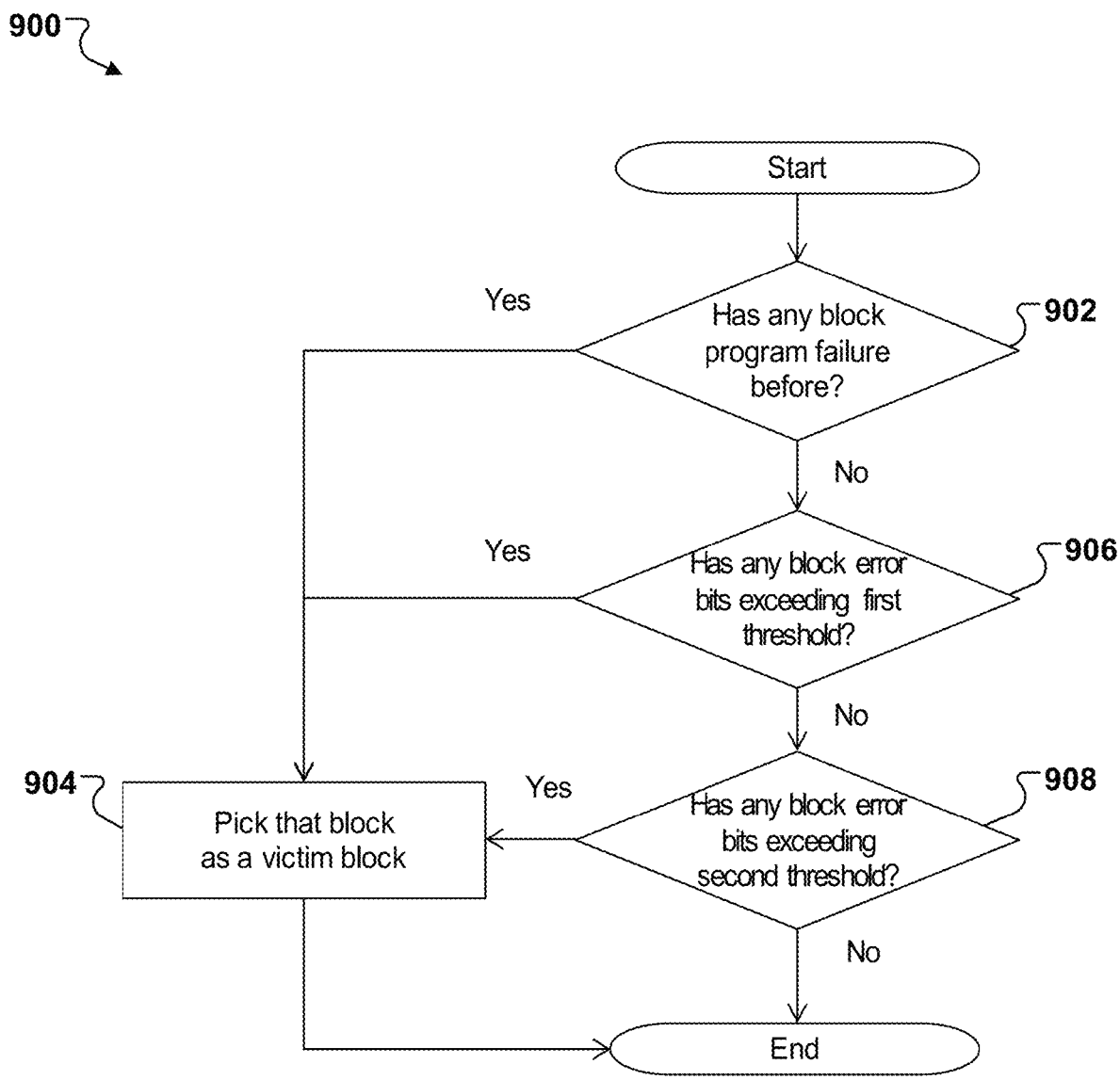
FIG. 9 illustrates an example of a process for picking a victim block by an urgent strategy, according to one or more implementations.
Figure 10:
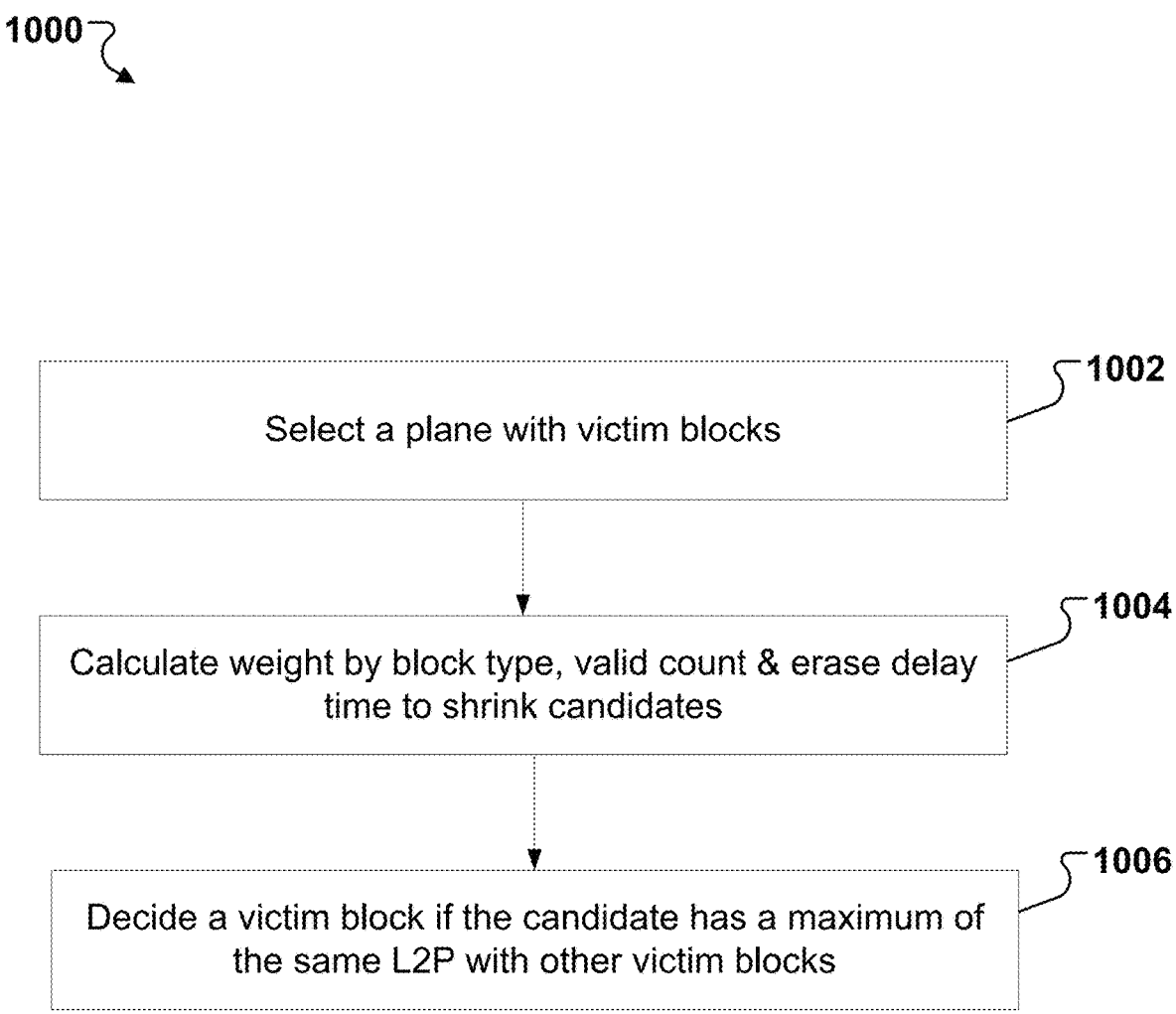
FIG. 10 illustrates an example of a process for picking a victim block by an on-demand strategy, according to one or more implementations.

A data block in data block group 306 can be assigned as a victim block according to one or more strategies, as discussed in further details in FIGS. 8 to 10. The victim block is put in victim block group 308 that is managed at the single block level.

Figure 11:
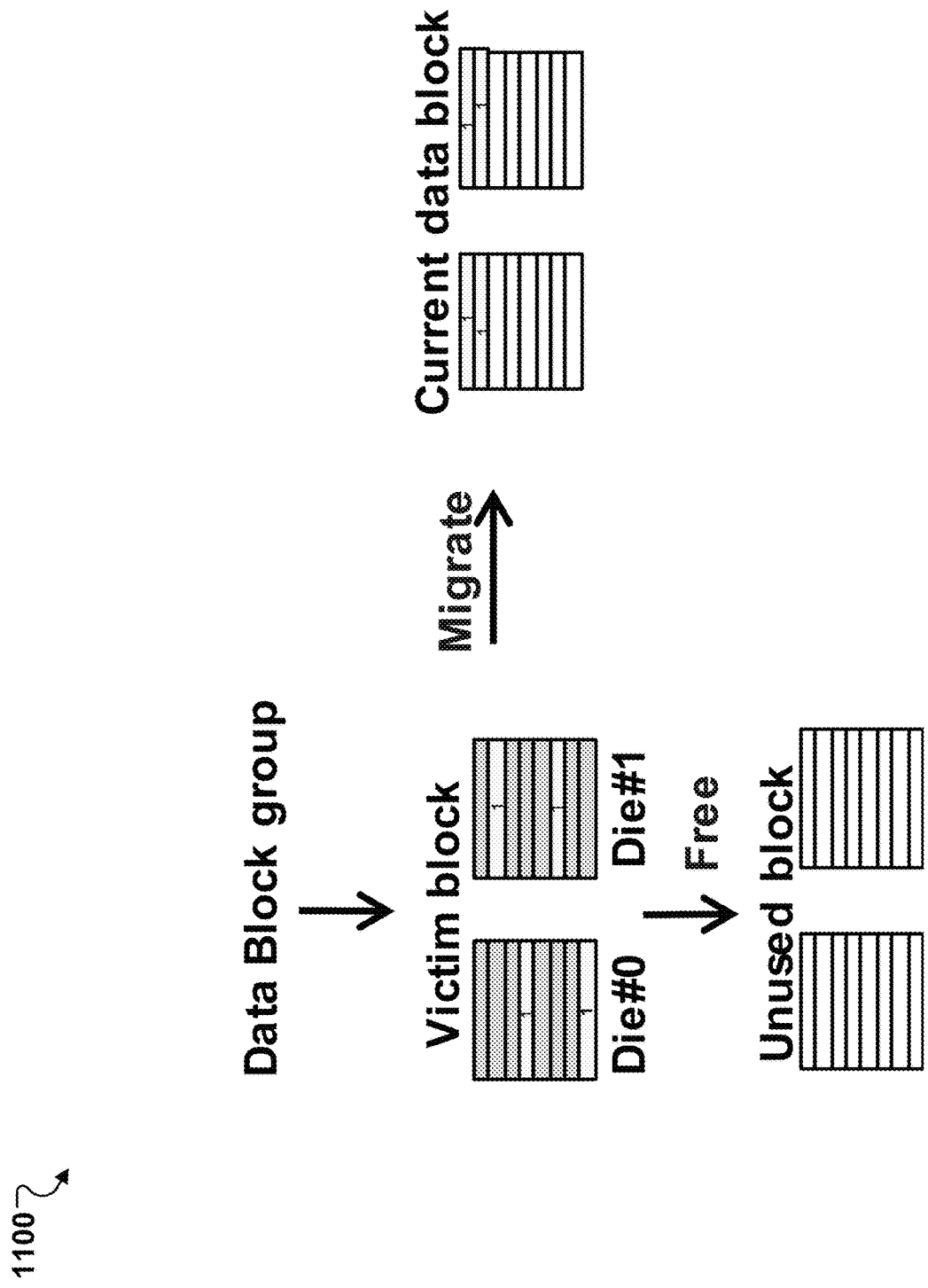
FIG. 11 illustrates an example reclaim operation, according to one or more implementations.

As discussed with further details in FIGS. 11 to 12C, a reclaim operation can be performed on one or more victim blocks in victim block group 308. Valid data in the victim blocks can be migrated to one or more super blocks (or CDBs) in current data block group 304. Then a victim block full of invalid data can be freed, e.g., erased, to become unused blocks, which can be pushed to unused block group 302.

As noted above, current data block group 304 is managed at the super block level, while each of unused block group 302, data block group 306, and victim block group 308 is managed at the single block level. In such a way, this memory can be managed with a fine granularity, which can improve or optimize efficiency of the memory.

FIG. 4A illustrates an example block information table 400 of a plane in a memory. The memory can be the memory 116 of FIG. 1, and the plane can be any plane in FIG. 1, e.g., Plane #0 in Die #0. The plane can include N−1 number of physical blocks. Each plane can have its own table that is independent from other planes in the same memory. A memory controller, e.g., the controller 112 of FIG. 1, can manage the block information table for each plane in the memory. As illustrated in table 400, the block information can include a number of parameters as discussed below.

A CDB flag field indicates whether a single block is in a current data block (CDB). If the CDB flag is true, the single block is in a CDB. If the CDB flag is false, the single block is not in a CDB and can be a data block, e.g., in data block group 306 of FIG. 3, or an unused block, e.g., in unused block group 302 of FIG. 3.

An unused flag field can indicates whether a single block is an unused data block. If the unused flag is true, the single block can be picked to a current data block, and its valid count and read count are set to 0. If the unused flag is false, the single block can be in a CDB or a data block in data block group.

An erase count field is used to record a number of times that a single block is executed by an erase operation. Erase count is related to P/E (program/erase) cycles of the single block. When erase count is beyond a threshold, the single block can be considered to be an urgent block or a bad block that has worn out.

A valid count field is used to record how many valid data is stored in a single block. The larger the valid count is, the more valid data is stored, which indicates the less unused count is left and the faster the single block is used up or becomes a data block in data block group. A total valid count (or a total of valid counts) of a plane is a sum of valid counts of all the blocks in the plane.

Read count by page records how many times each page in a single block was read. Read count can also record how many times the single block was read, that is, a sum of read operation on the single block.

As an example, as shown in FIG. 4A, for block number 1, the CDB flag is true, the unused flag is false, the erase count is 6, the valid count is 102, and the read count by page is respectively 100, 54, . . . , 77. For block number N−1, the CDB flag is false, the unused flag is true, the erase count is 5, the valid count is 0, and the read count by page is all 0.

The block information can also include erase delay time for a single block, which records a period of time from a latest time point when the single block was erased to a current time point. FIG. 4B shows an example erase information table 450, which includes erase order, e.g., from $1^{st}$ last to $10^{th}$ last, and associated weight (%). The smaller the erase order is, the higher the weight is. For example, as shown in FIG. 4B, from $1^{st}$ last to $10^{th}$ last erase order, the weight is 90%, 80%, 70%, . . . , 0, respectively.

FIG. 4C shows another example erase information table 470, which includes erase delay time and associated weight (%). The less the erase delay time is, and the higher the weight is. As shown in FIG. 4C, the weight is 100% for the erase delay time (EDT) of less than 1 min, 60% for the erase delay time less than 3 min, 30% for the erase delay time less than 15 minutes, 10% for the erase delay time less than 2 hours, and 0 for the erase delay time no less than 2 hours, respectively.

The erase information tables 450 and/or 470 can be used to prevent frequently erasing block in a short time, which may cause wear out memory cells seriously. In some cases, "order" or "delay time" can be used as a meter to restrain picking a free block and/or selecting a victim block. For example, during picking a free block, the controller can get a respective erase count of each free block and refer to table 450 or 470 to get a respective weight of the free block. Then, for each free block, a respective weighted number can be calculated by multiplying the respective weight by a number, e.g., a maximum erase count of all of the free blocks. The controller can then pick a free block from among the free blocks by comparing values for the blocks that are calculated from the respective weighted numbers for the blocks. For example, a value for a particular block can be calculated as a sum of the respective erase count for the block and the respective weighted number for the block. For example, the controller can pick a free block with the smallest sum of its respective erase count and respective weighted number.

In some cases, the controller can select a victim block according to a procedure similar to picking a free block. The controller can get a respective erase count of each candidate victim block and refer to table 450 or 470 to get a respective weight of the candidate victim block. Then, for each candidate victim block, a respective weighted number can be calculated by multiplying the respective weight by a number, e.g., a maximum valid count of all of the candidate victim blocks. The controller can then select a victim block by comparing a sum of a respective valid count and the respective weighted number among the candidate victim blocks. For example, the controller can select a victim block with the smallest sum of the respective valid count and the respective weighted number.

Figures 5A, 5B, 5C:
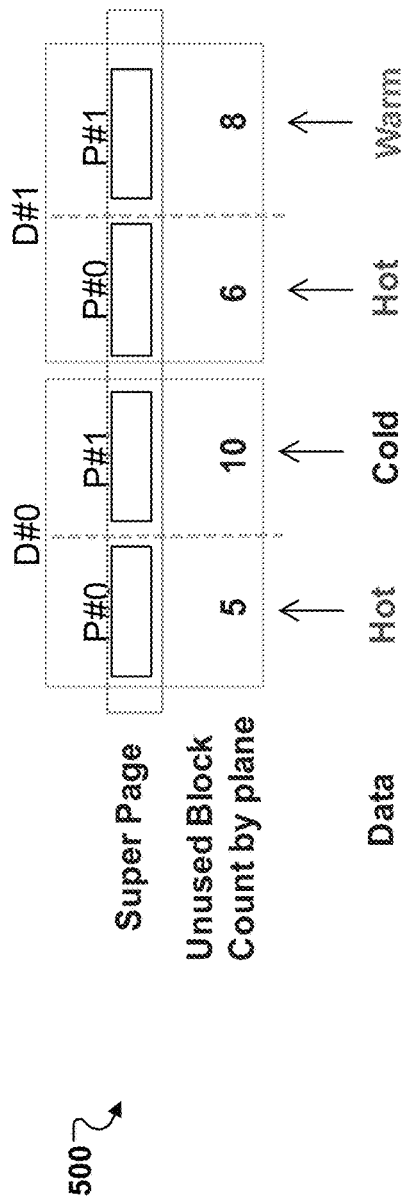
FIG. 5A illustrates an example technique for specifying a super block based on unused block count, according to one or more implementations.
FIG. 5B illustrates an example technique for specifying a super block based on erase count, according to one or more implementations.
FIG. 5C illustrates an example technique for specifying a super block based on valid count balance, according to one or more implementations.

FIG. 5A illustrates an example technique 500 for specifying a super block based on unused block count. The super block combines physical blocks from planes with close unused block counts. As illustrated in FIG. 5A, the super block combines four physical blocks from four respective planes in dies D #0 and D #1. The unused block count for each of the planes is 5, 10, 6, and 8, respectively.

As noted above, data can be characterized according to its character such as hotness/coldness. As an example shown in FIG. 5A, data to be written includes four groups of data: first hot data, second hot data, warm data, and cold data. The four groups of data can be arranged to respective pages in a super page of the super block based on its character and characters of the blocks in the super block. In some examples, a plane with unused block count less than others may have more valid data than others. As hot data is easier to become invalid data than cold data, the hot data is be put in a block of a plane with a lower unused block count than other planes. In such a way, the block can be easier to be reclaimed to an unused block, and the unused block counts of the planes can be balanced. As illustrated in FIG. 5A, the first hot data is arranged to a block in plane P #0 with 5 unused block count in D #0, the second hot data is arranged to a block in plane P #0 with 6 unused block count in D #1, the warm data is arranged to a block in plane P #1 with 8 unused block count in D #1, and the cold data is arranged to a block in plane P #1 with 10 unused block count in D #0.

FIG. 5B illustrates another example technique 530 for specifying a super block based on erase count. First, a single unused block with the smallest erase count among physical blocks in each plane is selected. Second, if an erase count of a particular selected block is much larger than the other selected blocks, the particular selected block is given up, that is, not selected or combined to a super block.

In some implementations, a threshold is determined based on the erase counts of the selected blocks from the planes. If a particular selected block has an erase count larger than the determined threshold, the particular selected block is given up, i.e., not used in the super block; if a particular selected block has an erase count no larger than the determined threshold, the particular selected block is combined into the super block.

As illustrated in FIG. 5B, the erase count of each of the selected blocks from four planes is 5, 6, 4, and 51, respectively. A threshold can be determined to be an average of the erase counts of the selected blocks multiplied by a factor. The factor can be a constant, e.g., predetermined by empirical data. As an example, the factor is 2, and the threshold is 33. Only the selected block from Plane #1 in Die #1 has the erase count 51 which is larger than the threshold, thus, the selected block from Plane #1 in Die #1 is given up. The other three selected blocks can be combined to a super block.

FIG. 5C illustrates a further example technique 550 for specifying a super block based on valid count balance. First, valid counts of physical blocks in each plane are summed to obtain a respective total valid count for the plane (a total of the valid counts or a sum of the valid counts). Second, the respective total valid counts of the planes are compared, and based on a result of the comparison, whether to select a physical block from one of the planes for the super block is determined. If a plane has a total valid count much larger than the other planes, the super block is determined not to include a physical block from the plane. In some examples, a threshold is determined based on the respective total valid counts of the planes, and the total valid count of each plane can be compared to the threshold to determine whether to select a physical block from the plane for the super block.

As illustrated in FIG. 5C, the total valid count is 3452 for Plane #0 in Die #0, 3500 for Plane #1 in Die #0, 6980 for Plane #0 in Die #1, and 3587 for Plane #1 in Die #1, respectively. Since 6980 is much larger than the other total valid counts, the controller does not select the physical block from Plane #0 in Die #1.

Figure 6:
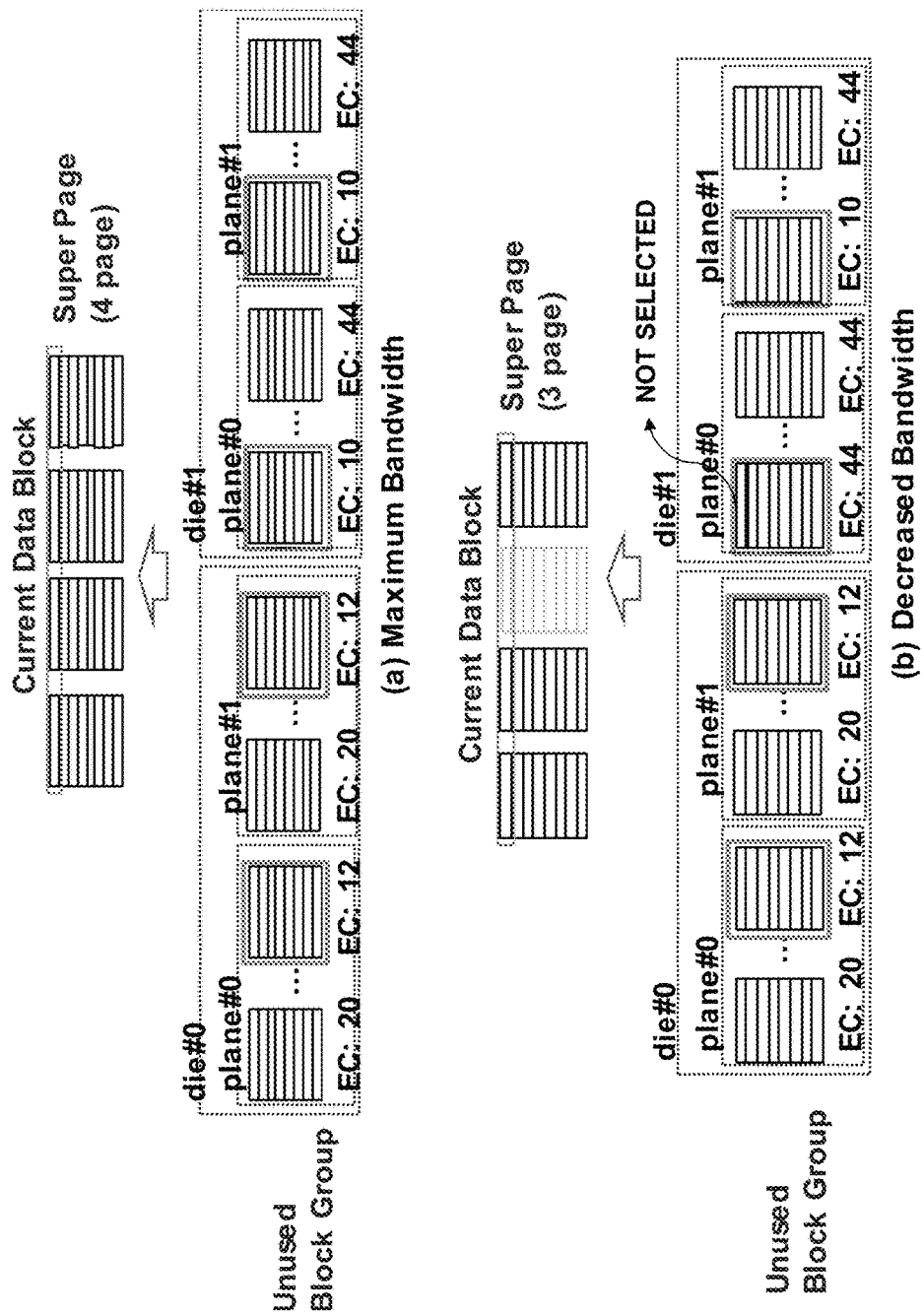
FIG. 6 illustrates an example relationship between bandwidth and unused block group, according to one or more implementations.

FIG. 6 illustrates an example relationship 600 between bandwidth and unused block group. In scenario (a), the unused block group includes unused blocks from plane #0, plane #1 in die #0 and plane #0, plane #1 in die #1. As the smallest erase count of the unused blocks in each of the planes is 12, 12, 10, and 10, respectively, according to a selection technique such as the technique 530 of FIG. 5B, a block with the smallest erase counts in each of the planes is combined together to obtain a super block (or a current data block). Thus, the super block includes four single blocks from the four planes, and each super page in the super block includes four pages in the four single blocks. That is, the super page has a maximum bandwidth of 4.

In scenario (b), the unused block group includes unused blocks from plane #0, plane #1 in die #0 and plane #0, plane #1 in die #1. As the smallest erase count of the unused blocks in each of the planes is 12, 12, 44, and 10, respectively, 44 is too larger than the other smallest erase counts, thus no block is selected from plane #0 in die #1, according to a selection technique such as the technique 530 of FIG. 5B. Three blocks with the smallest erase counts in the other three planes are selected to obtain a super block (or a current data block). Thus, the super block includes three single blocks from the three planes, and each super page in the super block includes three pages in the three single blocks. That is, the super page has a decreased bandwidth of 3.

A combination of a super block can be decided by a number of factors including: memory type of the block to satisfy a demand (e.g., SLC, MLC, TLC, QLC, or any combination thereof), erase delay time for decreasing damage, total erase count for loading balance, and each erase count for wear leveling. A memory controller can refer to one or more of the factors to pick free or unused blocks from different planes, e.g., by priority and/or formula. The priority and/or formula can vary for different memories.

Figure 7:
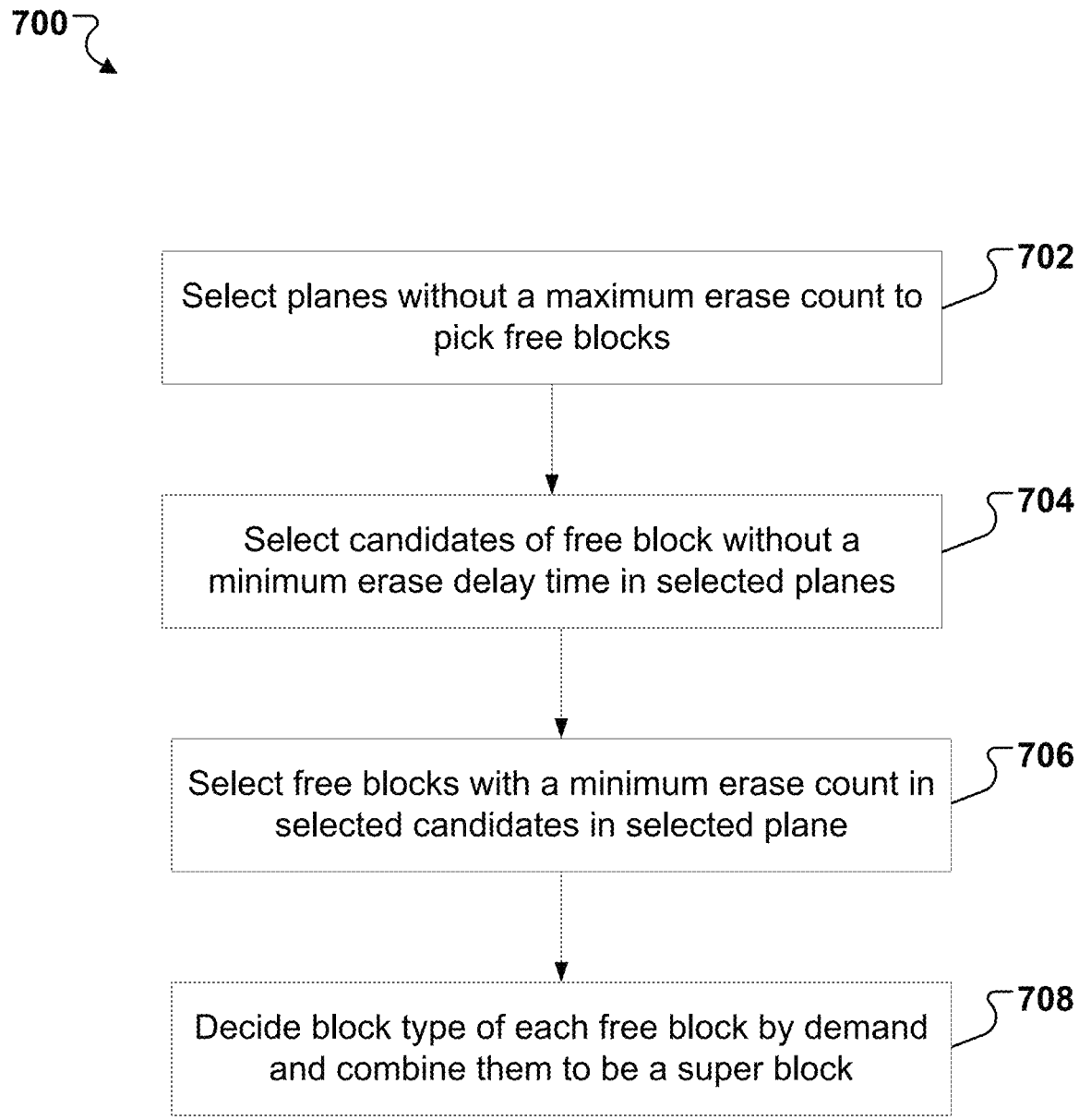
FIG. 7 illustrates an example of a process for deciding a combination of a super block, according to one or more implementations.

FIG. 7 illustrates an example of a process 700 for deciding a combination of a super block for a memory according to a priority. The memory can be the memory 116 of FIG. 1. The process 700 can be performed by a controller, e.g., the controller 112 of FIG. 1.

Planes without a maximum erase count are selected (702) and free blocks are selected from these selected planes. As discussed above in FIG. 5B, according to the technique 530, a plane having a maximum erase count of blocks, e.g., Plane #1 in Die #1 of FIG. 5B, can be given up. The planes without the maximum erase count, e.g., Planes #0 and #1 in Die #0 and Plane #0 in Die #1 of FIG. 5B, are selected for the super block.

Candidates of free blocks without a minimum erase delay time in selected planes are selected (704). As discussed above in FIG. 4C, it is better to have a longer erase delay time to decrease damage of a block. Within each selected plane, a free block with a minimum erase delay time among blocks in the selected plane is given up, and the other free blocks in the plane can be selected to be candidates of free block for the super block. In some examples, a threshold of erase delay time, e.g., 1 hour, is predetermined, and a free block having an erase delay time larger than the threshold can be selected to be a candidate of free block for the super block.

A free block with a minimum erase count in each of the planes is selected from the candidates (706). This step can be performed according to the technique 530 of FIG. 5B.

A block type of each selected free block is decided by a demand and the selected free blocks are combined to be the super block (708). Based on the demand, the memory type of the block, e.g., SLC, MLC, TLC, QLC, or a combination thereof can, be decided or determined. Then, each of the selected free block can be erased based on the respective decided memory type and combined to the super block.

FIG. 8 illustrates an example of a process 800 for picking a victim block in a plane in a memory. The memory can be the memory 116 of FIG. 1. The process 800 can be performed by a controller, e.g., the controller 112 of FIG. 1. As discussed below, the controller can pick up a victim block in a plane using one or more strategies.

The controller determines whether a number of unused blocks in the plane is less than a first threshold, e.g., an emergency reclaim threshold (802). The controller can manage unused block group (e.g., unused block group 302 of FIG. 3) by monitoring a block information table of the plane, e.g., the block information table 400 of FIG. 4A.

If the controller determines that the number of unused blocks in the plane is less than the first threshold, the controller performs a greedy strategy by picking a single block with the smallest valid count than others in the plane as a victim block (804).

If the controller determines that the number of unused blocks in the plane is no less than the first threshold, the controller determines whether there is any urgent block happened (806). In some cases, the controller can mark a block as an urgent block during runtime. In response to determining that the number of unused blocks in the plane is no less than the first threshold, the controller can check whether there is any marked urgent block.

In some cases, in response to determining that the number of unused blocks in the plane is no less than the first threshold, the controller checks individual blocks, for example, as shown in FIG. 9, to determine whether a block is a bad block or a single block with a number of error bits exceeding a threshold. If the controller determines that there is an urgent block, the controller performs an urgent strategy by picking the urgent block as a victim block (808).

FIG. 9 illustrates an example of a process 900 for picking a victim block by an urgent strategy. A controller, e.g., the controller of FIG. 8, determines whether any block had a program failure before (902). If the controller determines that a block had a program failure before, the controller picks the block as a victim block (904).

If the controller determines that no block had a program failure before, the controller further determines whether any block has a number of error bits exceeding a first threshold (906). The first threshold can be a worn-out threshold that is pre-selected to indicate that a block is worn out. The first threshold is for checking endurance issues of a block. Each block has a limited program/erase (P/E) cycle. If a block is overused, data in the block is subject to distortion more easily, and error bits of data may be larger. If the number of error bits of a block exceeds the first threshold, the block can be considered to be worn out or to be a bad block or to have an endurance issue. If the controller determines that a block has a number of error bits exceeding the first threshold, the controller picks the block as a victim block (904).

If the controller determines that no block has a number of error bits exceeding the first threshold, the controller determines whether any block has a number of error bits exceeding a second threshold (908). The second threshold can be a refreshing threshold, and is for checking read disturbance and/or retention issue. If a block has the number of error bits exceeding the second threshold, the data of the block may need to be migrated to another block to ensure data correctness, then the block is reclaimed into unused block group. The second threshold is smaller than the first threshold. If the controller determines that no block has the number of error bits exceeding the second threshold, the process 900 ends. If the controller determines that a block has a number of error bits exceeding the second threshold, the controller picks that block as a victim block (904).

In some implementations, the process 900 is performed by the controller to determine whether there is an urgent block. If the controller determines that a block has program failure before, the controller can mark the block as an urgent block. If the controller determines that a block has a number of error bits exceeding the first threshold, the controller can mark the block as an urgent block. If the controller determines that a block has a number of error bits exceeding the second threshold, the controller can mark the block as an urgent block. As noted above, in step 806 of FIG. 8, the controller can check whether there is any block marked as an urgent block.

Referring back to FIG. 8, if the controller determines that there is no urgent block, the controller determines whether the number of unused blocks is less than a second reclaim threshold (810). The second reclaim threshold can be considered as a "greedy" reclaim threshold. The second reclaim threshold is larger than the first reclaim threshold. If the controller determines that the number of unused blocks is less than the second reclaim threshold, the process 800 proceeds to step 804, that is, the controller performs the greedy strategy by picking a single block with the smallest valid count than other blocks in the plane as a victim block.

If the controller determines that the number of unused blocks is no less than the second reclaim threshold, the controller performs on-demand strategy (812), e.g., as discussed with further details in FIG. 10. For the on-demand strategy, the controller can refer to one or more of a list of factors to pick a victim block by a priority and/or a formula. The list of factors can include erase count, quantity of victim blocks in the plane, erase delay time, block type, valid count, read count, and a number of other victim blocks same as the block in a logical to physical table (L2P). The list of factors can be maintained in a block information table of the plane, e.g., the table 400 of FIG. 4A, the table 450 of FIG. 4B, and/or the table 470 of FIG. 4C.

In some examples, a weight value of each single block in the plane is determined. The controller can pick a single block with a weight value exceeding a threshold as a victim block. If no single block meets the criteria, the controller determines not to pick any block in the plane as a victim block.

FIG. 10 illustrates an example of a process 1000 for picking a victim block by an on-demand strategy. The process 1000 can be performed by a controller, e.g., the controller of FIG. 8.

The controller selects a plane with one or more victim blocks (1002). Then the controller calculates a respective weight value for each block in the plane to shrink candidates of victim block (1004). As noted above, the controller can calculate the respective weight value based on one or more factors in a block information table of the plane. The factors can include block type, valid count, and/or erase delay time. In the present disclosure, a block with a smaller weight value is better to be selected as a victim block.

In some examples, the factors include block type and valid count, which can be used to maximize a benefit of data migration. For example, a block can store 300 units if configured to SLC, 200 units if configured to MLC, and 100 units if configured to TLC. For a block in the plane, the weight value can be valid count/bits per cell, where the bits per cell is based on a block type. If the block has a weight value smaller than a threshold, the controller can select the block as a candidate of victim block.

In some examples, the factors include erase delay time that can be used to shrink damage from frequent erase. As illustrated in the erase information table 470 of FIG. 4C, the shorter the erase delay time is, the more weight the block has, and the less possibility the block is selected as a victim block. In some cases, if a weight of erase delay time of a block is smaller than a threshold, the controller can select the block as a candidate of victim block.

In some examples, the factors include block type, valid count, and erase delay time. A weight value of a block can be expressed by a formula as follows:

$$\text{Weight value} = \text{weight of erase delay time}*n + \text{valid count/bits per cell},$$

where n is an integer. To avoid picking a block with a short (or small) erase delay time, n can be an integer large than 1, e.g., 2. The controller can compare the calculated weight value of the block to a threshold. If the weight value is smaller than the threshold, the controller can select the block as a candidate of victim block.

Among the candidates of victim blocks, if a candidate of victim block has a maximum number of other victim blocks same as the candidate in an L2P table, e.g., in the same memory partition as the candidate, the controller picks the candidate as a victim block (1006).

According to one or more strategies as discussed above in FIGS. 8-10, one or more blocks in a data block group, e.g., data block group 306 of FIG. 3, can be picked or assigned as victim blocks. The victim blocks can be reclaimed by a reclaim operation.

FIG. 11 illustrates an example reclaim operation 1100. Two victim blocks are in Die #0 and Die #1, respectively. Each victim block includes two pages of valid data (unshaded and labeled with '1' in FIG. 11), with the rest pages of data being invalid. The four pages of valid data from the two victim blocks are migrated together to two super pages in a super block (e.g., a current data block). After the valid data is migrated to the super block, the valid data in the victim blocks become invalid data, thus the victim blocks are full of invalid data, which can be freed (e.g., erased) to become unused blocks.

A reclaim operation can be performed based on one or more priority polices. In some examples, a victim block with an urgent type can be assigned with a high priority. The victim block can be picked from an urgent block. In some examples, as discussed in step 802 of FIG. 8, if a number of unused blocks in a plane is less than an emergency reclaim threshold, it needs rapidly releasing victim blocks in the plane to unused blocks. Thus, the victim blocks in the plane can be assigned with a high priority.

In some examples, as discussed in step 810 of FIG. 8, if a number of unused blocks in a plane is less than a greedy reclaim threshold, a "garbage collection" is triggered by a greedy strategy. The greedy reclaim threshold is higher than the emergency reclaim threshold, and the victim blocks picked by the greedy strategy can have a lower priority than the victim blocks picked by an urgent strategy.

In some examples, victim blocks with a same logical group (e.g., in a same L2P table) have the same priority, and data in the victim blocks can be gathered together for migration, which can reduce metadata overhead.

FIGS. 12A-12C illustrate example steps of a reclaim operation performed by a controller. FIG. 12A illustrates an example data migration step 1200 in the reclaim operation. As shown FIG. 12A, plane P #0 in Die D #0 has three victim blocks, plane P #1 in Die D #0 has two victim blocks, plane P #0 in Die D #1 has one victim block, and plane P #1 in Die D #1 has one victim block. The controller can arrange data placement by one or more priority policies as discussed above. In FIG. 12A, two pages of valid data in P #0, D #0, one page of valid data in P #1, D #0, and one page of valid data in P #0, D #1 are selected to migrate to a super page in a current data block that includes four pages in four single blocks. The selected pages of valid data are labelled with '1' in FIG. 12A.

FIG. 12B illustrates an example block freeing step 1230 in the reclaim operation. If a block is full of invalid data, e.g., block 1232 in P #1, D #0, the block is freed (or erased) and pushed to unused block group of P #1, D #0.

FIG. 12C illustrates an example victim block picking step 1250 in the reclaim operation. After a victim block is freed, as shown in FIG. 12B, the controller can continue to pick other victim blocks and keep migrating until a trigger reclaim condition is accomplished. For example, block 1252 in P #1, D #1 is picked by the controller to be a victim block, which can be further picked by the controller to reclaim. The trigger reclaim condition can be that the number of unused blocks in a plane is no less than an emergency reclaim threshold or no less than a greedy reclaim threshold, or no urgent block needed to be handled, as noted above.

Figure 13:
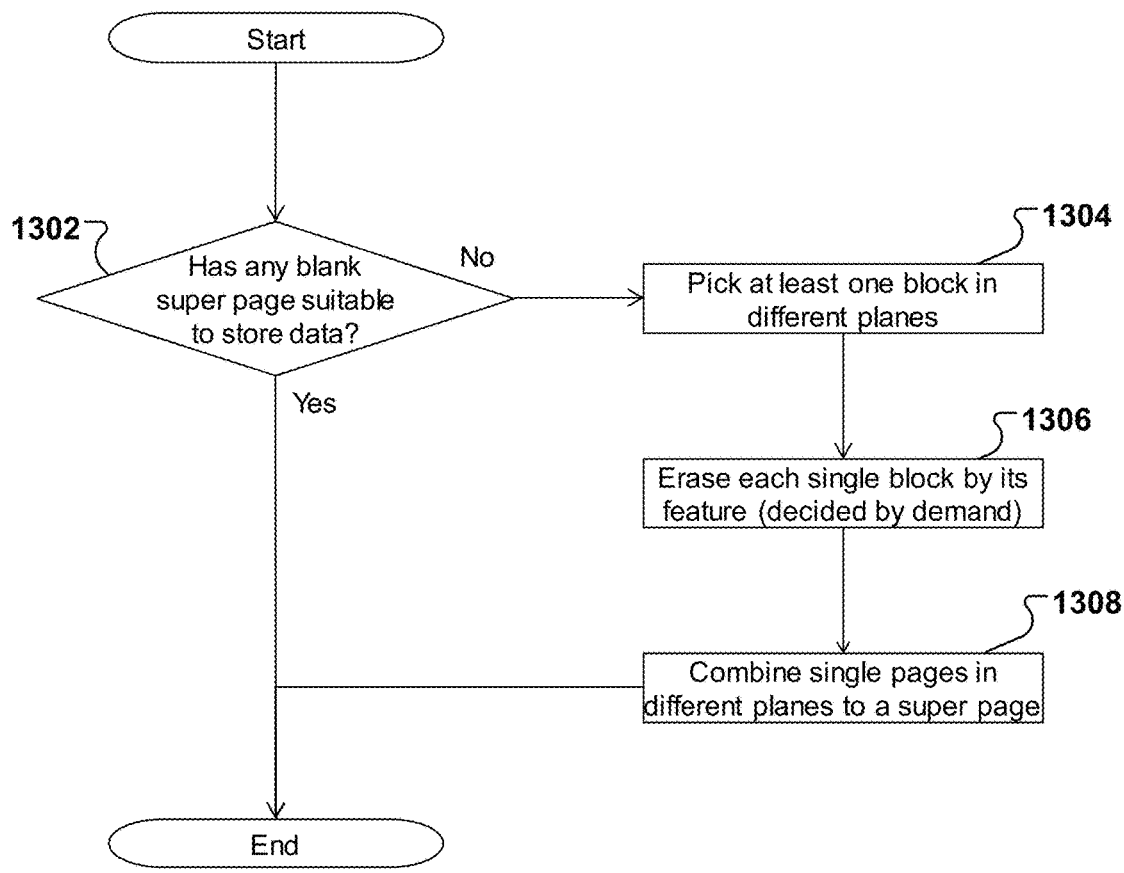
FIG. 13 illustrates an example of a process for allocating a super page according to a demand, according to one or more implementations.

FIG. 13 illustrates an example of a process 1300 for allocating a super page according to a demand. The demand can include writing update data from a host device, e.g., the host device 120 of FIG. 1, into a memory, e.g., the memory 116 of FIG. 1. The process 1300 can be performed by a controller, e.g., the controller 112 of FIG. 1. The demand can also include migrating valid data in the memory and/or writing metadata like data for FTL management.

The controller determines whether there is any blank super page suitable to store the data associated with the demand (1302). A super block can be specified in the memory, as noted above. The super block includes a number of super pages. The super block can include one or more physical blocks which can have the same block type or different block types.

If the controller determines that there are one or more blank super pages suitable to store the data, the process 1300 ends and the controller can program the data in the blank super pages.

If the controller determines that there is no blank super page suitable to store the data, the controller picks at least one block in different planes of the memory (1304), for example, according to one or more strategies described above. The controller then erases each single block by its feature decided by the demand (1306). For example, if the demand needs to store security data, a block can be erased as an SLC block. If the demand needs to store stream data, a block can be erased as an MLC block. The controller then combines the erased single blocks from the planes to a super block, where single pages in the single blocks from the planes are combined to one or more super pages (1308). The super pages can be used to store the data associated with the demand.

Figure 14:
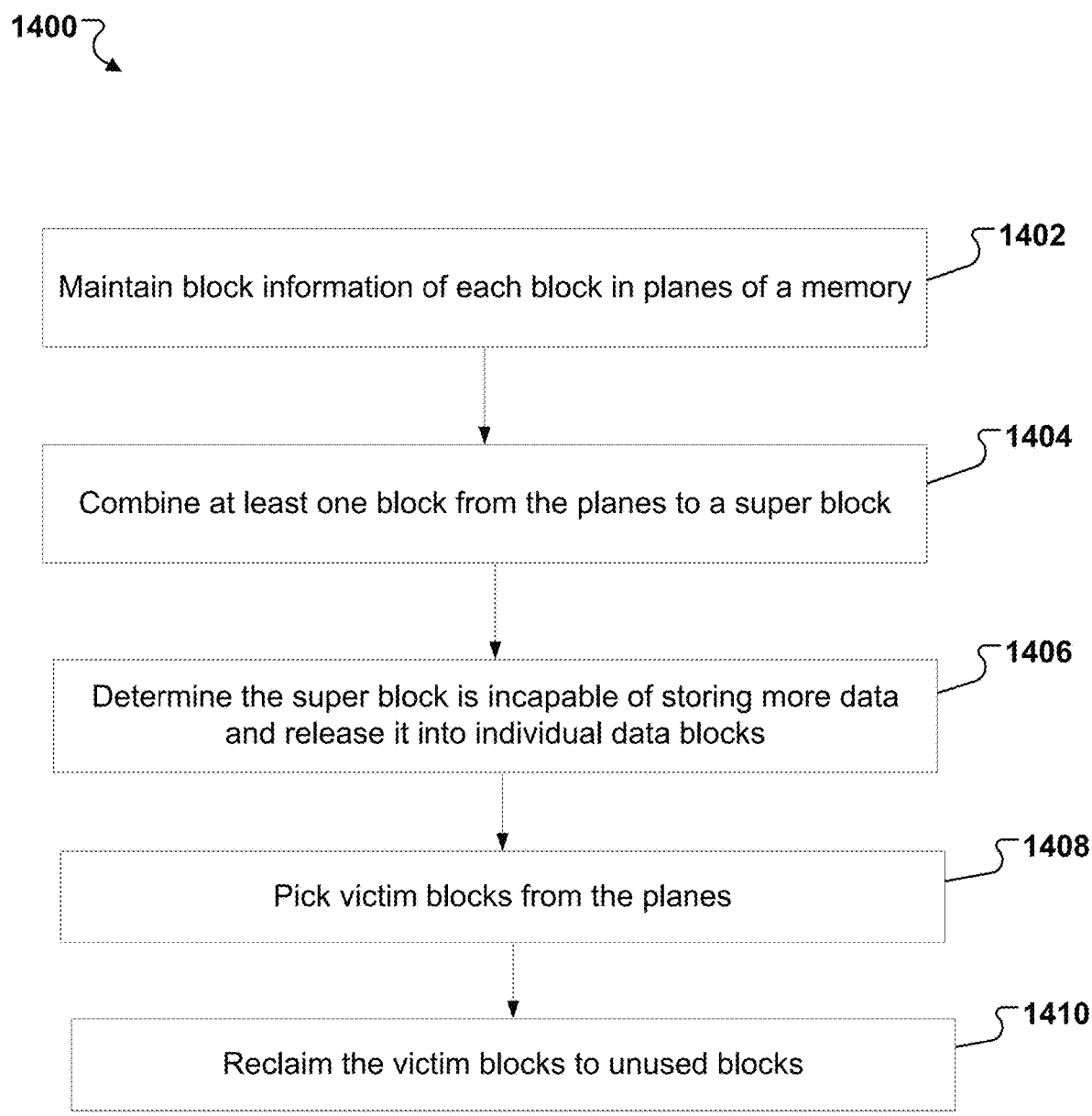
FIG. 14 illustrates an example of a process for managing block arrangements of a super block in a memory, according to one or more implementations.

FIG. 14 illustrates an example of a process 1400 for managing block arrangement of super blocks in a memory. The memory can be the memory 116 of FIG. 1. The memory can include one or more memory devices and can have at least two planes of physical blocks. The process 1400 can be performed by a controller, e.g., the controller 112 of FIG. 1. The controller is configured to manage block arrangement of super blocks in the memory.

The controller maintains block information of each individual physical block in the planes (1402). The block information of the physical block can include one or more parameters including erase count, valid count, read counts of pages, erase delay time, a first flag indicating whether the physical block is in a current data block, and a second flag indicating whether the physical block is an unused block. Each plane can have a block information table storing block information of physical blocks in the plane. The block information tables of the planes can be independent from each other.

The controller combines at least one block from the planes to a super block (1404). The controller selects no more than one physical block from each of the planes to obtain the super block based on the block information of the physical blocks in the planes.

In some examples, the controller is configured to, for each of the planes, select an unused physical block having a minimum erase count in the physical blocks of the plane based on the block information of the physical blocks of the plane. The controller can then be configured to determine a threshold based on the erase counts of the selected unused physical blocks from the planes. In response to a determination that a selected unused physical block has an erase count larger than the determined threshold, the controller can determine not to select the selected unused physical block for the super block. In response to a determination that a selected unused physical block has an erase count no larger than the determined threshold, the controller can select the selected unused physical block for the super block.

In some examples, the controller is configured to determine a respective sum of valid counts of physical blocks in each of the planes, compare the respective sums of valid counts of the planes, and determine, based on a result of the comparison, whether to select a physical block from one of the planes for the super block. For example, the controller can determine a threshold based on the respective sums of valid counts of the planes. If a plane has a sum of valid counts exceeding the threshold, the controller can determine not to select a physical block from the plane. If a plane has a sum of valid counts no more than the threshold, the controller can determine to select a physical block from the plane.

In some examples, the controller is configured to select a plane from the planes, where the controller picks, in each plane, an unused block with an erase count smaller than other blocks and without a minimum erase delay time in the plane. If one of the picked blocks has an erase count much larger than the other picked blocks and/or has an erase delay time much smaller than the other picked blocks, the controller can determine not to select the unused physical block for the super block.

The super block can be used for storing update data, migrated data or metadata. When the controller determines that the super block is incapable of storing more data, the controller releases the super block into individual data blocks (1406).

The controller picks one or more victim blocks from the planes (1408), e.g., according to one or more strategies. In some examples, in response to a determination that a number of unused blocks in a plane is smaller than a first reclaim threshold, e.g., an emergency reclaim threshold, the controller performs a greedy strategy by picking a physical block with a minimum valid count in one of the planes as a victim block.

In some examples, in response to a determination that a number of unused blocks in the planes is no smaller than a first reclaim threshold and that there is an urgent block, the controller performs an urgent strategy by picking the urgent block as a victim block. The controller can be configured to determine a physical block to be an urgent block by determining at least one of: a program failure happens in the physical block, a number of error bits in the physical block exceeds a first threshold (e.g., a worn-out threshold for an endurance issue), or an error count of the physical block exceeds a second threshold (e.g., a refreshing threshold for a read disturbance and/or retention issue).

In some examples, in response to a determination that a number of unused blocks in the planes is no smaller than a second reclaim threshold, the controller picks a physical block with a weight value exceeding a threshold as a victim block. The weight value of the physical block can be determined based on one or more parameters including block type, valid count, and erase delay time.

In some examples, the controller is configured to select a plane from the planes. The selected plane can have a maximum number of victim blocks among the planes. The selected plane can also have multiple physical blocks each having a weight value smaller than the predetermined threshold. The controller can determine, for each of the multiple physical blocks, a number of victim blocks in the plane that are in a logical to physical (L2P) table same as the block. The controller can pick one with the maximum number of victim blocks in the same L2P table as a victim block.

The controller reclaims the victim blocks to unused blocks (1410). The controller can perform a reclaim operation based on one or more priority policies. The controller can be configured to arrange valid data in one or more victim blocks from one or more planes to be migrated based on the reclaim priority policies, and then migrate the valid data simultaneously to a current data block, e.g., another super block having one or more free super pages. The controller can then erase a victim block having no valid data to obtain an unused physical block.

In some implementations, the controller is configured to determine one or more characteristics of data to be written in the memory. The data can include at least one of data from a device external from the memory, valid data to be migrated from the memory, or metadata associated with the memory. The characteristics can include at least one of a security level, an internal system level, or a level of read & write frequency.

In some examples, the controller selects the physical blocks from each of the planes to obtain the super block based on the determined characteristics of the data to be written.

In some examples, the controller is configured to: in response to a determination that there is no blank super page to store the data, select the physical blocks from each of the planes, erase each of the selected physical blocks based on the determined characteristics of the data to be written, and combine single pages from the physical blocks in the planes to obtain a super page for storing the data.

In some examples, the controller is configured to: categorize the data based on the determined characteristics of the data, arrange the data to individual physical blocks in the super block based on the determined characteristics of the data and the block information of the individual physical blocks in the super block, and program one or more super pages of the super block to store the data.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory controller for managing block arrangement of super blocks in a memory, the memory controller comprising:
    control circuitry coupled to the memory having at least two planes of physical blocks and configured to:
        maintain block information of each physical block in the planes, wherein the block information of the physical block comprises a flag indicating whether the physical block is an unused block; and
        select one or more physical blocks from the planes for a super block based on the block information of the physical blocks in the planes, comprising:
            selecting an unused physical block from a specified plane for the super block, wherein an erase delay time of the selected unused physical block is larger than a minimum of erase delay times of physical blocks in the specified plane, each of the erase delay times of the physical blocks in the specified plane representing a period of time from a latest time point when a respective physical block was erased to a current time point.

2. The memory controller of claim 1, wherein the block information of the physical block comprises at least one of erase count, valid count, read counts of pages, erase delay time, or a flag indicating whether the physical block is in a current data block.

3. The memory controller of claim 1, wherein the control circuitry is configured to, for each of the planes, select an unused physical block having a minimum erase count in the physical blocks of the plane based on the block information of the physical blocks of the plane.

4. The memory controller of claim 3, wherein the control circuitry is configured to:
    determine a threshold based on the erase counts of the selected unused physical blocks from the planes;
    in response to a determination that a selected unused physical block has an erase count larger than the determined threshold, determine not to select the selected unused physical block for the super block; and
    in response to a determination that a selected unused physical block has an erase count no larger than the determined threshold, select the selected unused physical block for the super block.

5. The memory controller of claim 1, wherein the control circuitry is configured to:
    determine a respective sum of valid counts of physical blocks in each of the planes;
    compare the respective sums of valid counts of the planes; and
    determine, based on a result of the comparison, whether to select a physical block from one of the planes for the super block.

6. The memory controller of claim 1, wherein the control circuitry is configured to select the unused physical block from the specified plane for the super block by
    determining a respective maximum value of erase count of physical blocks in each of the planes;
    selecting the specified plane from the planes, the specified plane having the respective maximum value of erase count smaller than a maximum of the respective maximum values of erase count of the planes;
    selecting unused physical blocks in the specified plane, wherein an erase delay time of each of the selected unused physical blocks is larger than the minimum of erase delay times of physical blocks in the specified plane; and
    selecting a physical block with a minimum erase count among the selected unused physical blocks in the specified plane as the selected unused physical block for the super block.

7. The memory controller of claim 1, wherein the control circuitry is configured to:
    in response to a determination that the super block is incapable of storing more data, release the super block to obtain individual data blocks.

8. The memory controller of claim 1, wherein the control circuitry is configured to:
in response to a determination that a number of unused blocks in a plane is smaller than a first reclaim threshold, pick a physical block with a minimum valid count in the plane as a victim block.

9. The memory controller of claim 1, wherein the control circuitry is configured to:
in response to a determination that a number of unused blocks in a plane is no smaller than a reclaim threshold and that there is an urgent block in the plane, pick the urgent block as a victim block.

10. The memory controller of claim 9, wherein the control circuitry is configured to determine a physical block to be an urgent block by determining at least one of:
a program failure having occurred in the physical block,
a number of error bits in the physical block exceeding a first threshold, or
the number of error bits in the physical block being smaller than the first threshold and exceeding a second threshold, the second threshold being smaller than the first threshold.

11. The memory controller of claim 1, wherein the control circuitry is configured to:
arrange valid data in one or more victim blocks from one or more planes to be migrated based on one or more reclaim priority polices; and
migrate the valid data simultaneously to a current data block.

12. The memory controller of claim 1, wherein the control circuitry is configured to:
erase a victim block having no valid data to obtain an unused physical block.

13. The memory controller of claim 1, wherein the control circuitry is configured to determine one or more characteristics of data to be written in the memory,
wherein the data includes at least one of data from a device external from the memory, valid data to be migrated from the memory, or metadata associated with the memory, and
wherein the characteristics include at least one of a security level, an internal system level, or a level of read & write frequency.

14. The memory controller of claim 13, wherein the control circuitry is configured to:
combine the physical blocks from each of the planes to the super block based on the determined characteristics of the data to be written.

15. The memory controller of claim 13, wherein the control circuitry is configured to:
in response to a determination that there is no blank super page to store the data, combine the physical blocks from each of the planes to the super block;
erase each of the selected physical blocks based on the determined characteristics of the data to be written; and
combine single pages from the physical blocks in the planes to obtain a super page for storing the data.

16. The memory controller of claim 13, wherein the control circuitry is configured to:
categorize the data based on the determined characteristics of the data;
arrange the data to individual physical blocks in the super block based on the determined characteristics of the data and the block information of the individual physical blocks in the super block; and
program one or more super pages of the super block to store the data.

17. The memory controller of claim 1, wherein the control circuitry is configured to:
pick a plurality of physical blocks from a plurality of respective planes based on the block information of the physical blocks in the planes, at least two of the picked physical blocks having different position numbers in the corresponding respective planes, and
combine the plurality of picked physical blocks from the plurality of respective planes to obtain a second super block.

18. A memory system comprising:
a memory comprising at least two planes of physical blocks; and
a memory controller configured to manage the physical blocks of the memory by
maintaining block information of each individual physical block in the planes, wherein the block information of the physical block comprises a flag indicating whether the physical block is an unused block; and
selecting one or more physical blocks from the planes for a super block based on the block information of the physical blocks in the planes, comprising:
for each of the planes, selecting an unused physical block having a minimum erase count in physical blocks of the plane based on the block information of the physical blocks of the plane;
determining an erase count threshold based on erase counts of the selected unused physical blocks from the planes; and
in response to a determination that a selected unused physical block has an erase count no larger than the determined erase count threshold, selecting the selected unused physical block for the super block.

19. A memory controller for managing block arrangement of super blocks in a memory, the memory controller comprising:
control circuitry coupled to the memory having at least two planes of physical blocks and configured to:
maintain block information of each physical block in the planes, wherein the block information of the physical block comprises a flag indicating whether the physical block is an unused block;
selecting one or more physical blocks from the planes for a super block based on the block information of the physical blocks in the planes; and
in response to a determination that a number of unused blocks in a plane is no smaller than a reclaim threshold, picking a physical block in the plane as a victim block by comparing a weight value of the physical block to a weight value threshold, wherein the weight value is determined based on one or more parameters including block type, valid count, erase order, and erase delay time.

20. The memory controller of claim 19, wherein the control circuitry is configured to:
determine a respective number of victim blocks of each of the planes;
select a plane having a maximum of the respective numbers of victim blocks among the planes, the selected plane including one or more other physical blocks having the weight values smaller than the predetermined threshold, wherein a smaller valid count corresponds to a smaller weight value than a larger valid count, and a longer erase delay time corresponds to a smaller weight value than a shorter erase delay time; and pick the physical block by determining that the physical block is in a logical to physical (L2P) table same as a particular number of victim blocks in the plane and the particular number is higher than that of each of the one or more other physical blocks in the plane.

* * * * *